US 6,624,496 B2

(12) United States Patent
Ku et al.

(10) Patent No.: US 6,624,496 B2
(45) Date of Patent: Sep. 23, 2003

(54) METHOD OF FORMING T-SHAPED ISOLATION LAYER, METHOD OF FORMING ELEVATED SALICIDE SOURCE/DRAIN REGION USING THE SAME, AND SEMICONDUCTOR DEVICE HAVING T-SHAPED ISOLATION LAYER

(75) Inventors: Ja-Hum Ku, Sungnam (KR); Dong-Ho Ahn, Suwon (KR); Chul-Sung Kim, Anyang (KR); Jae-Yoon Yoo, Seoul (KR); Sug-Hun Hong, Suwon (KR); Chul-Joon Choi, Goyang (KR)

(73) Assignee: Samsung Electronics Co. Ltd., Suwon (KR)

( * ) Notice: Subject to any disclaimer, the term of this patent is extended or adjusted under 35 U.S.C. 154(b) by 0 days.

(21) Appl. No.: 10/044,991

(22) Filed: Jan. 15, 2002

(65) Prior Publication Data
US 2002/0090795 A1 Jul. 11, 2002

Related U.S. Application Data

(62) Division of application No. 09/573,268, filed on May 18, 2000, now Pat. No. 6,383,877.

(30) Foreign Application Priority Data

May 20, 1999 (KR) .............................. 99-18268
Oct. 11, 1999 (KR) .............................. 99-43784

(51) Int. Cl.$^7$ .............................................. H01L 21/76
(52) U.S. Cl. ..................... 257/510; 438/301; 438/427
(58) Field of Search ............................ 257/506–510, 257/377, 413; 438/300, 301, 296, 427, 221

(56) References Cited

U.S. PATENT DOCUMENTS 4,472,240 A * 9/1984 Kameyama ................. 438/427
5,242,847 A    9/1993 Ozturk et al. ............... 438/300

(List continued on next page.)

OTHER PUBLICATIONS

Y. Nakahra et al., "Ultra–Shallow In–situ Doped Raised Source/Drain Structure for Sub–Tenth Micron CMOS", IEEE, 1996, pp. 174–175.

(List continued on next page.)

Primary Examiner—Wael Fahmy
Assistant Examiner—Anh Duy Mai

(57) ABSTRACT

A method of forming a T-shaped isolation layer, a method of forming an elevated salicide source/drain region using the same, and a semiconductor device having the T-shaped isolation layer are provided. In the method of forming the T-shaped isolation layer, an isolation layer having a narrow trench region in the lower portion thereof and a wide trench region in the upper portion thereof is formed on a semiconductor substrate. Also, in the method of forming the elevated salicide source/drain region, the method of forming the T-shaped isolation layer is used. In particular, conductive impurities can also be implanted into the lower portion of the wide trench region which constitutes the head of the T-shaped isolation layer and is extended to both sides from the upper end of the narrow trench region by controlling the depth of the wide trench region in an ion implantation step for forming the source/drain region.

6 Claims, 9 Drawing Sheets

U.S. PATENT DOCUMENTS

| | | | | |
|---|---|---|---|---|
| 5,342,480 A | | 8/1994 | Nishizawa et al. | 438/300 |
| 5,536,675 A | * | 7/1996 | Bohr | 438/427 |
| 5,665,616 A | | 9/1997 | Kimura et al. | 438/234 |
| 5,691,232 A | | 11/1997 | Bashir et al. | 438/424 |
| 5,786,255 A | * | 7/1998 | Yeh et al. | 438/300 |
| 5,824,586 A | * | 10/1998 | Wollesen et al. | 438/300 |
| 5,874,317 A | * | 2/1999 | Stolmeijer | 438/296 |
| 6,121,100 A | | 9/2000 | Andideh et al. | 438/305 |
| 6,165,871 A | | 12/2000 | Linn et al. | 438/437 |

OTHER PUBLICATIONS

C.P. Chao et al., "Low Resistance Ti or Co Salicided Raises Source/Drain Transistors for Sub–0.13 Micron CMOS Technologies", IEEE, 1997, pp. 103–106.

T. Uchino et al., "A Raised Source/Drain Technology Using In–situ P–doped SiGe and B–Doped Si for 0.1 Micron CMOS ULSIs", IEEE, 1997, pp. 479–482.

T. Ohguro et al., "High Performance RF Characteristics of Raised Gate/Source/Drain CMOS with Co Silicide", IEEE, 1998, pp. 136–137.

* cited by examiner

METHOD OF FORMING T-SHAPED ISOLATION LAYER, METHOD OF FORMING ELEVATED SALICIDE SOURCE/DRAIN REGION USING THE SAME, AND SEMICONDUCTOR DEVICE HAVING T-SHAPED ISOLATION LAYER

CROSS REFERENCE TO RELATED APPLICATIONS

This is a divisional application of application Ser. No. 09/573,268, filed May 18, 2000, now U.S. Pat. No. 6,383,877 which is hereby incorporated by reference in its entirety for all purposes.

BACKGROUND OF THE INVENTION

The present application claims priority under 35 U.S.C. §119 to Korean Patent Application Nos. 99-18268 and 99-43784, respectively filed on May 20, 1999 and Oct. 11, 1999.

1. Field of the Invention

The present invention relates to a semiconductor device and a method of manufacturing the same, and more particularly, to a semiconductor device having an isolation layer of improved structure, a method of forming the isolation layer, and a method of forming a source/drain region using the isolation layer.

2. Description of the Related Art

As the integration density of semiconductor devices increases, isolation techniques for electrically isolating adjacent transistors from each other become more important. A local oxidation of silicon (LOCOS) process is a typical isolation technique. However, the LOCOS process is known to be unsuitable for highly integrated semiconductor devices having a design rule less than or equal to 0.5 $\mu$m. Therefore, a trench isolation technique involving the formation of a trench in a predetermined region of a semiconductor substrate using a photolithography process and the formation of an isolation layer by filling the trench with an insulating material can be used.

The aspect ratio of trenches formed using conventional trench isolation techniques has recently been increased to be greater than or equal to 3, in order to keep up with the increasing integration density of semiconductor devices. As a result, trench isolation causes problems. Namely, when a trench having aspect ratio greater than or equal to 3 is filled with insulating material using an established deposition method such as a chemical vapor deposition (CVD) method, an overhang phenomenon occurs at the entrance to the trench. Accordingly, a void is formed in the trench. When a trench isolation layer is formed by performing a planarizing process such as a chemical mechanical polishing (CMP) process in a following step, the void formed in the trench may be opened. The opening of the void can reduce the reliability of the semiconductor device. To be specific, a process of forming a gate electrode may be performed after forming the trench isolation layer. At this time, a bridge occurs between adjacent gate electrodes since the opened void formed in the trench is filled with a conductive material such as conductive polysilicon during formation of the gate electrode.

Therefore, a method of filling the trench with a material such as undoped silicate glass (USG) having excellent gap-filling characteristics has recently been used. However, even with the use of special gap-filling materials, when the aspect ratio of the trench exceeds certain limits, it is not possible to prevent a void from occurring.

Also, when the aspect ratio of the trench increases, problems are caused during a wide-region planarizing process which must be performed in order to complete the formation of the isolation layer. In conventional trench isolation techniques, it is usual to planarize the entire surface of the semiconductor substrate after filling the trench that is formed by a photolithography process with insulating material. When the aspect ratio of the trench increases, a severe step difference is formed on the entire surface of the semiconductor substrate on which the insulating material is deposited. Therefore, it is not possible to obtain a desired degree of planarization even though the entire surface of the semiconductor substrate is wide-region planarized.

After the trench isolation layer is formed according to conventional technology, a semiconductor device such as an MOS transistor is formed on an active region defined by the isolation layer. Namely, a gate electrode is formed by interposing a gate oxide layer on the active region and source/drain regions are formed on both sides of the gate electrode. In the case of a semiconductor device having a design rule less than or equal to 0.2 $\mu$m, the source/drain region is formed to be thin in order to improve the operating characteristics of the semiconductor device. In addition, a silicide layer is formed by performing a salicide process on the gate electrode and the source/drain region in order to reduce the signal delay time of the semiconductor device. When the silicide layer is formed on the source/drain region by performing the salicide process, junction leakage current becomes greater at the boundary between the isolation layer and a junction region than if the salicide process had not been performed. In order to solve this problem, a method of forming the source/drain region as elevated above the semiconductor substrate and then performing the salicide process on the elevated source/drain region has recently been suggested. However, it is not possible to reduce the junction leakage current below the desired value even though the salicide process is performed after forming the elevated source/drain region.

The above problems of the conventional method of forming the trench isolation layer will now be described with reference to FIGS. 1A through 2C. Referring to FIG. 1A, after forming a trench 12 in a predetermined portion of a semiconductor substrate 10, the trench 12 is filled with a gap-filling dielectric layer 14. For example, the trench 12 can be filled with a silicon oxide layer formed on the entire surface of the semiconductor substrate 10 using a CVD method. As mentioned before, when the aspect ratio of the trench 12 is greater than or equal to 3, an overhang phenomenon occurs at the entrance to the trench 12 as the deposition process proceeds. As a result, a void 16 is formed in the trench 12.

Referring to FIG. 1B, a trench isolation layer 14 is formed by planarizing the entire surface of the semiconductor substrate 10 using, for example, a CMP method. The void formed in the trench isolation layer 14 is opened during the planarizing process. As a result, in a next step of forming a gate with a gate electrode material, the void is filled with the gate electrode material, so that a bridge is created between adjacent gate electrodes.

FIG. 2A is a plan view showing a portion of the semiconductor substrate 10 after forming trench isolation layers A, gate electrodes B, and active regions C. FIG. 2B is a sectional view taken along the line X–X' of FIG. 2A. Referring to FIG. 2A and FIG. 2B, the active regions C are defined by forming the trench isolation layers A in predetermined portions of the semiconductor substrate 10. A void 16 having an upper portion that is opened is formed in the trench isolation layer A. The gate electrodes B under which the gate oxide layer is interposed are formed by sequentially forming the gate oxide layer (not shown) and the polysilicon layer on the semiconductor substrate 10 and performing a photolithography process. At this time, the void 16 having an upper portion that is opened is filled with the conductive material, for example, polysilicon 18 which forms the gate electrode B. Furthermore, the polysilicon inside the void 16 is not completely removed in the photolithography process used to pattern the gate electrodes. This results in the formation of the bridge I between the adjacent gate electrodes B.

Referring to FIG. 2C, which is a sectional view taken along the line Y–Y' of FIG. 2A, the bridge I generated between the adjacent gate electrodes B is clearly visible. The void 16 having an upper portion that is opened and which is formed in the trench isolation layer A is filled with polysilicon 18. Accordingly, the bridge I is formed between the adjacent gate electrodes B. This reduces the reliability of the semiconductor device.

The problems of the conventional method of forming the elevated salicide source/drain region will now be described with reference to FIGS. 3 through 6. Referring to FIG. 3, a trench isolation layer 20 is formed on the semiconductor substrate 10. A gate electrode pattern G including a gate oxide layer 21, a gate electrode 22, and a side-wall spacer 23 is formed on an active region defined by the trench isolation layer 20. A layer of semiconductor material 24 such as silicon is selectively grown on active regions on both sides of the gate electrode pattern G and on the gate electrode 22. Referring to FIG. 4, elevated source/drain regions 25 are formed by implanting conductive impurities such as n-type impurities onto the entire surface of the substrate 10 using the gate electrode pattern G as an ion implantation mask. At this time, a layer of semiconductor material 24' containing impurities is formed on the gate electrode 22.

Referring to FIG. 5, silicide layers 26 are formed on the elevated source/drain regions 25 and on the gate electrode 22 by performing the salicide process. Namely, a layer of transition metal (not shown) is deposited on the entire surface of the semiconductor substrate 10, and then a portion of the layer of transition metal is changed into silicide by means of a thermal process. The transition metal which is not changed into the silicide layers 26 is removed. When the silicide layers 26 are formed on the elevated source/drain regions 25 according to the conventional technology, the silicide layer 26 can be so formed as to be extended into the boundary between the isolation layer 20 and the source/drain region 25 as shown in 11 of FIG. 5, thus generating a junction leakage current. That is, the silicide layer 26 is formed to be thick at the boundary between the trench isolation layer 20 and the source/drain region 25, since the transition metal deposited at the boundary of the trench isolation layer 20 and the elevated source/drain region 25 operates as a surplus silicide layer source. Accordingly, the junction leakage current characteristic of the semiconductor device deteriorates, thus increasing the power consumption of the semiconductor device.

SUMMARY OF THE INVENTION

The present invention is therefore directed to a method of forming on isolation layer which substantially overcomes one or more of the problems due to the limitations and disadvantages of the related art.

It is therefore an object of the present invention to provide a method of forming an isolation layer by which it is possible to prevent the generation of a void in the isolation layer.

It is another object of the present invention to provide a method of forming a source/drain region whereby it is possible to reduce junction leakage current generated at the boundary between the isolation layer and an active region.

It is another object of the present invention to provide a semiconductor device including an isolation layer having improved structure.

Accordingly, to achieve the first object, in a method of forming T-shaped isolation layers according to an aspect of the present invention, narrow trench regions, each of which having a first width and a first depth, are formed by etching predetermined portions of a semiconductor substrate. A first gap-filling dielectric layer for filling the narrow trench regions is formed. Wide trench regions, each of which having a second width which is greater than the first width and a second depth which is less than the first depth of the narrow trench regions, are formed in the upper parts of the narrow trench regions. T-shaped isolation layers are formed by forming a second gap-filling dielectric layer for filling the wide trench regions.

In the step of forming the narrow trench regions, a first mask pattern for exposing regions of the semiconductor substrate, of a predetermined width, is formed by sequentially stacking a first insulating layer pattern and a second insulating layer pattern having a large etching selectivity with respect to the first insulating layer pattern. Spacers are formed on the side walls of the first mask pattern with the same material as the second insulating layer pattern so that the width of the lower portions of the spacers corresponds to the first width. A second mask pattern for filling the space bounded by the exposed surface of the semiconductor substrate and the spacers is formed with the same material as the first insulating layer pattern. The spacers and the second insulating layer pattern of the first mask pattern are removed. Narrow trench regions having the first width and the first depth are formed by etching the semiconductor substrate using the first insulating layer pattern of the first mask pattern and the second mask pattern as etching masks.

A third mask pattern for exposing regions of the first gap-filling dielectric layer, each of which having the second width and being centered on the regions having the first width, is formed. Wide trench regions having a second width greater than the first width and a second depth less than the first depth of the narrow width trench regions are formed by etching the first gap-filling dielectric layer and the semiconductor substrate using the third mask pattern as an etching mask.

The first gap-filling dielectric layer is preferably formed by a thermal oxidation method.

In a method of forming T-shaped isolation layers according to another aspect of the present invention, a mask pattern for exposing regions of the upper surface of a semiconductor substrate, each of which having a first width, is formed. Wide trench regions having the first width and a first depth are formed by etching the semiconductor substrate using the mask pattern as an etching mask. Spacers are formed on the side walls of the wide trench regions and the side walls of the mask pattern. Narrow width trench regions having a second width less than the first width and a second depth greater than the first depth are formed by etching the semiconductor substrate using the spacers and the mask pattern as an etching mask. T-shaped isolation layers are formed by filling the narrow width trench regions and the wide trench regions with a dielectric material.

The insulating layer pattern and the spacers may be removed before filling the narrow width trench regions and the wide width trench regions with the dielectric material.

To achieve the second object, in a method of forming elevated salicide source/drain regions, T-shaped isolation layers which have narrow trench regions defined by a first width and a first depth in the lower portions thereof and wide trench regions defined by a second width greater than the first width and a second depth less than the first depth in the upper portions thereof are formed. A gate electrode pattern is formed with a gate oxide layer, gate electrodes, and spacers on an active region defined by the T-shaped isolation layers. A semiconductor material layer is grown on the active regions exposed on both sides of the gate electrode pattern and on the gate electrodes. Elevated source/drain regions are formed by implanting conductive impurities using the gate electrode pattern as an ion implantation mask so that the impurities are also implanted beneath the wide trench regions which constitute the heads of the T-shaped isolation layers and are extended to both sides from the upper ends of the narrow width trench regions. A silicide layer is formed on the elevated source/drain regions.

The depth of the wide trench regions is preferably less than or equal to 1,000 Å.

The semiconductor material layer is preferably grown using a selective epitaxial growth (SEG) method.

The silicide layer is one selected from the group consisting of a Ti silicide layer, a Ta silicide layer, a Ni silicide layer, a Co silicide layer, and a Pt silicide layer.

To achieve the third object, a semiconductor device comprising T-shaped isolation layers has narrow trench regions in the lower portions thereof and wide trench regions connected to the narrow trench regions and extended to both sides of the narrow trench regions in the upper portions thereof.

The semiconductor device can further comprise gate electrodes formed on an active region defined by the T-shaped isolation layers and source/drain regions formed by also implanting impurities beneath the wide trench regions which constitute the heads of the T-shaped isolation layers and are extended to both sides from the upper ends of the narrow width trench regions.

The source/drain regions are preferably elevated above the semiconductor substrate.

The semiconductor device can further comprise a salicide layer formed on the source/drain regions.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENTS

Figure 1A:
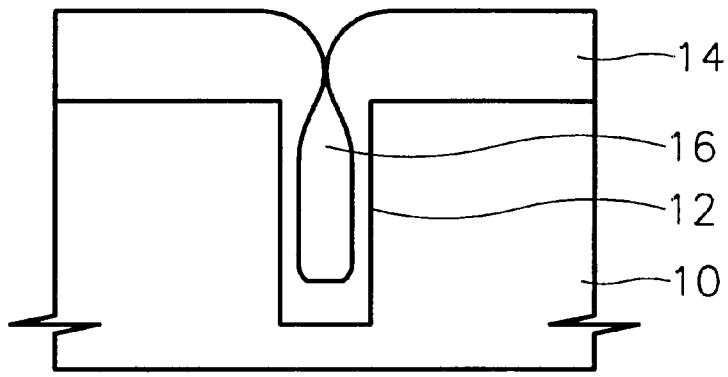
FIGS. 1A through 2C describe the problems of a conventional method of forming a trench isolation layer.
Figure 1B:
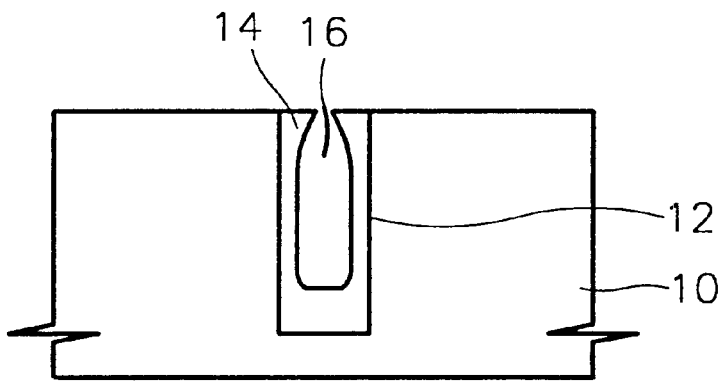
Figure 2A:
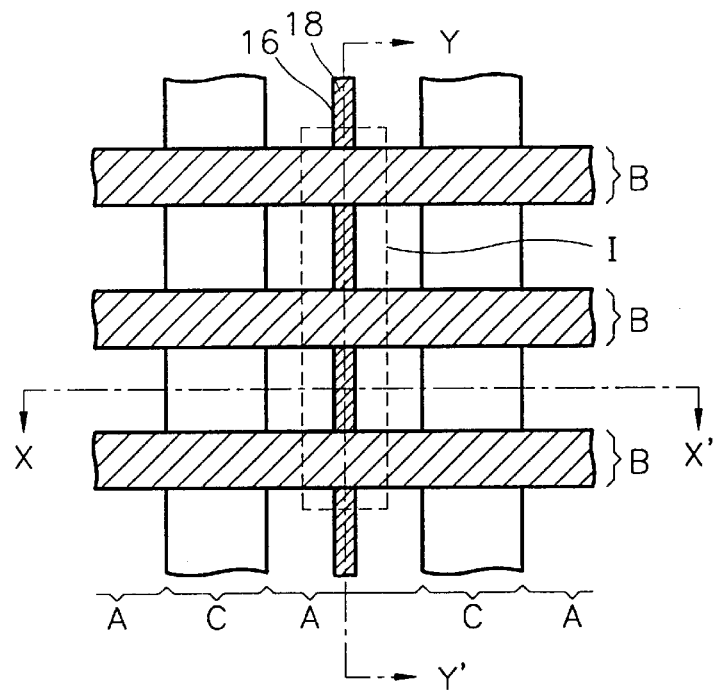
Figure 2B:
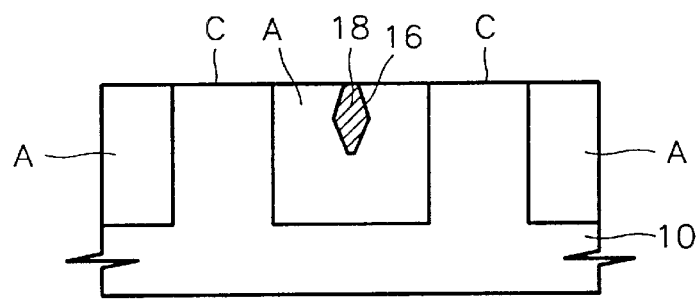
Figure 2C:
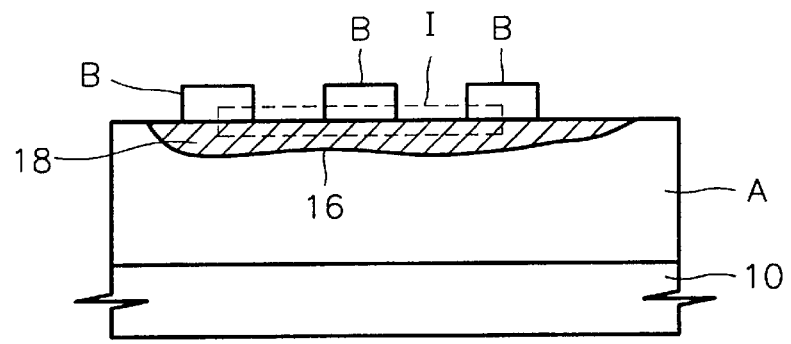
Figure 3:
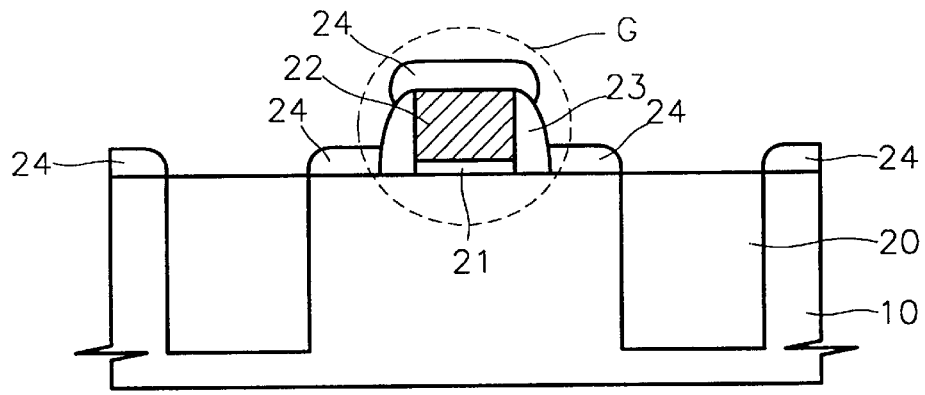
FIGS. 3 through 5 describe the problems of a conventional method of forming an elevated salicide source/drain region.
Figure 4:
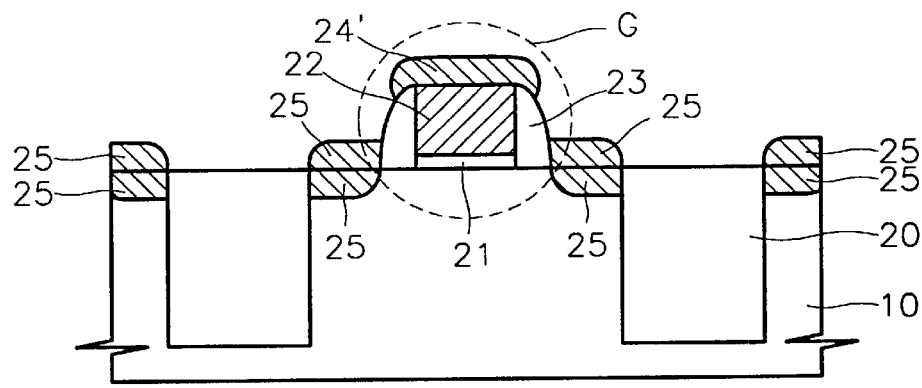
Figure 5:
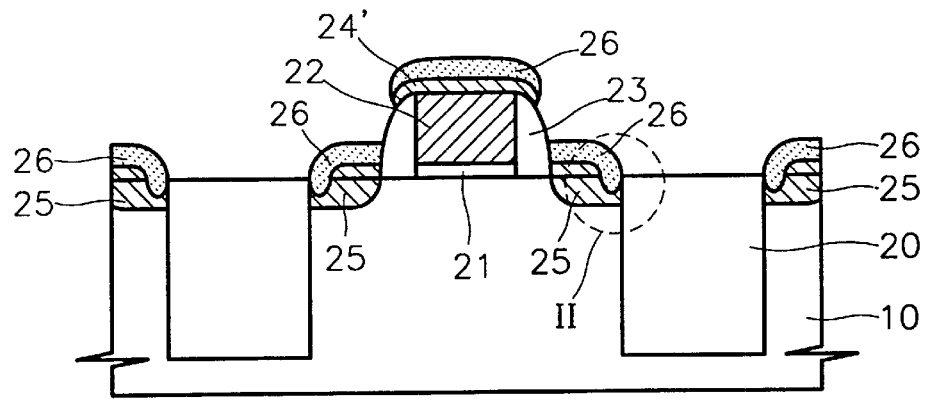

After describing first and second embodiments of a method of forming a T-shaped isolation layer in detail, embodiments of a method of forming an elevated salicide source/drain region using a method of forming a T-shaped isolation layer will be described in detail, with reference to the attached drawings. This invention may, however, be embodied in many different forms and should not be construed as being limited to the embodiments set forth herein; rather, these embodiments are provided in order that this disclosure be thorough and complete, and fully convey the concept of the invention to those skilled in the art. In the drawings, the thickness of layers and regions are exaggerated for clarity. It is also intended to be understood that when a layer is referred to as being on another layer or substrate, the forementioned layer can be directly on the other layer or substrate, or intervening layers may also be present. The same reference numerals appearing in different drawings represent the same elements, and a description of each element is provided only once, when the element first appears in a drawing.

Figure 6:
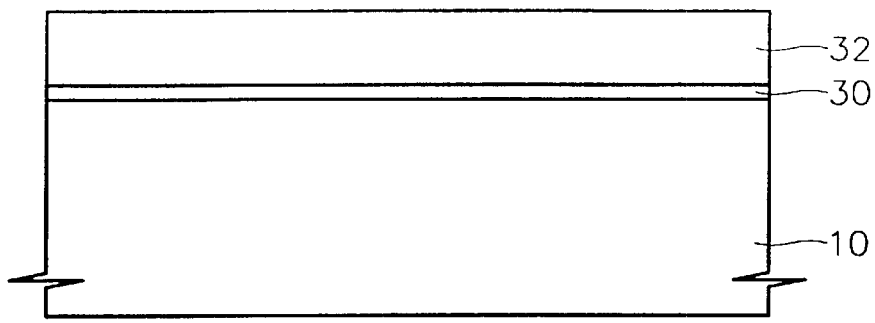
FIGS. 6 through 13 are sectional views showing a first embodiment of a method of forming a T-shaped isolation layer according to the present invention.

Referring to FIG. 6, in the method of forming a T-shaped isolation layer according to a first embodiment of the present invention, a first insulating layer 30 and a second insulating layer 32 are sequentially formed on a semiconductor substrate 10 using an established method, for example, a chemical vapor deposition (CVD) method. The first insulating layer 30 can be formed by thermal oxidation. The second insulating layer 32 is preferably formed of a material which has a large etching selectivity with respect to the first insulating layer 30. For example, the first insulating layer 30 can be a silicon oxide layer and the second insulating layer 32 can be silicon nitride or silicon oxinitride. The first insulating layer 30 can be formed to have a thickness between 100 Å and 500 Å. The second insulating layer 32 can be formed to have a thickness between 500 Å and 2,500 Å.

Figure 7:
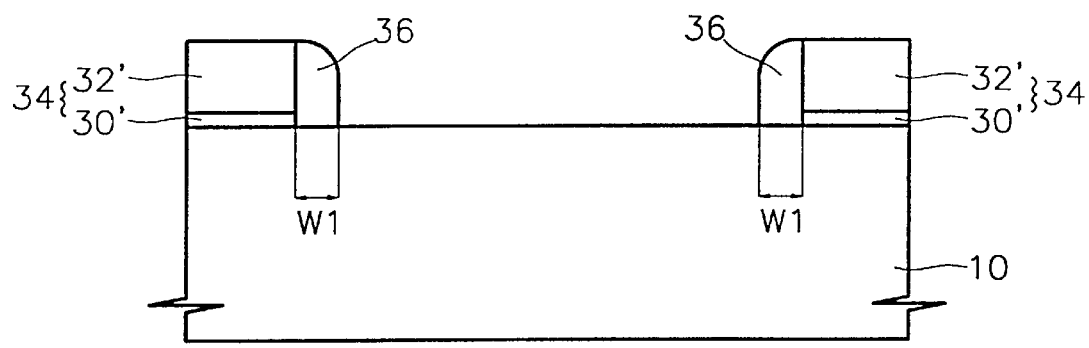

Referring to FIG. 7, first mask patterns 34 are obtained by photolithographically patterning the first insulating layer 30 and the second insulating layer 32. Then, spacers 36 are formed on the side-walls of the first mask patterns 34, and are preferably formed of the same material as the second insulating layer pattern 32'. For example, if the second insulating layer pattern 32' is silicon nitride, the spacer 36 is formed as follows: after forming the silicon nitride layer on the entire surface of the semiconductor substrate 10, the silicon nitride layer is etched in an anisotropic etching process until the spacer 36 is formed on the side wall of the first mask pattern 34. A width W1, within which the lower portion of the spacer 36 contacts the upper surface of the semiconductor substrate, corresponds to a first width (refer to W1 of FIG. 9) of a narrow width trench region.

Figure 8:
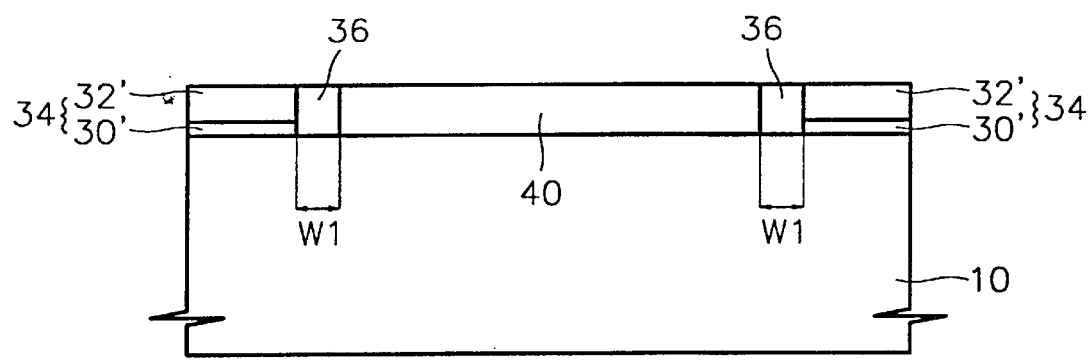

Referring to FIG. 8, an insulating layer is formed of the same material as the first insulating layer pattern 30' on the entire surface of the semiconductor substrate 10. For example, if the first insulating layer pattern 30' is silicon oxide, the second insulating layer is also formed of silicon oxide. The upper portion of the second insulating layer pattern 32' is exposed by planarizing the insulating layer using a chemical mechanical polishing (CMP) method or an etch back method. As a result, a second mask pattern 40 is formed between the spacers 36. Since a portion of the second insulating layer pattern 32' is etched while the planarizing process is performed, the second insulating layer pattern 32' becomes thinner.

Figure 9:
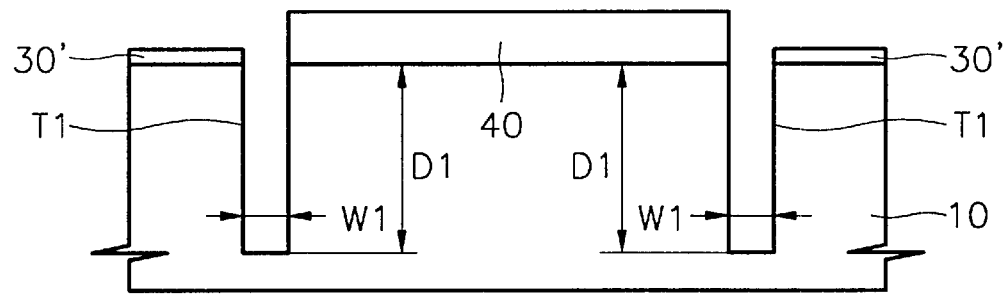

Referring to FIG. 9, the upper surface of the semiconductor substrate 10 is exposed by removing the second insulating patterns 32' and the spacers 36. Narrow width trench regions T1 having the first width W1 and a first depth D1 are formed in an etching process which uses the first insulating layer pattern 30' and the second mask pattern 40 as etching masks. Such a process can be, for example, a dry etching process. The narrow width trench regions T1 are preferably formed to a sufficient depth to make adjacent semiconductor devices electrically isolated from each other. Therefore, the first depth D1 is preferably between 2,000 Å and 6,000 Å.

Figure 10:
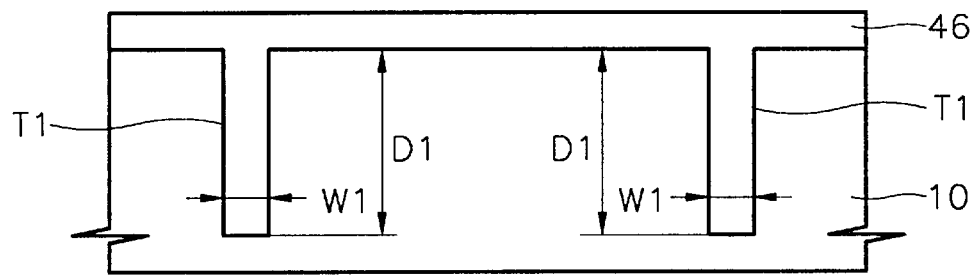

Referring to FIG. 10, the first insulating layer patterns 30' and the second mask pattern 40 are removed using an established method, for example, a wet etching method. Then, a first gap-filling dielectric layer 46 is formed in order to fill the narrow width trench regions T1. The first gap-filling dielectric layer 46 can be formed of silicon oxide or silicon oxinitride. A thermal oxide layer (not shown) may be formed along the inner wall of the narrow width trench region T1 before forming the first gap-filling dielectric layer 46. A nitride layer liner can be formed on the thermal oxide layer. The first gap-filling dielectric layer 46 is preferably formed to have a thickness greater than or equal to half of the first width W1. This is because it is possible to completely fill the narrow width trench regions T1 when the first gap-filling dielectric layer 46 is formed to have a thickness greater than or equal to half of the first width W1. The first gap-filling dielectric layer 46 can be formed using a CVD method or a thermal oxidation method, but a thermal oxidation method is preferred. This is because the possibility of forming a void in the narrow width trench region T1 is small when the first gap-filling dielectric layer 46 is formed using the thermal oxidation method.

When the aspect ratio of the narrow width trench region T1 is greater than or equal to 3, a void (not shown) may be formed in the first gap-filling dielectric layer 46 inside the narrow width trench regions T1. However, using a method of forming the T-shaped isolation layer according to the present invention, even though the void is formed in the first gap-filling dielectric layer 46 which fills the narrow width trench regions T1, the void is not opened during subsequent process steps. This will be described hereinafter.

Figure 11:
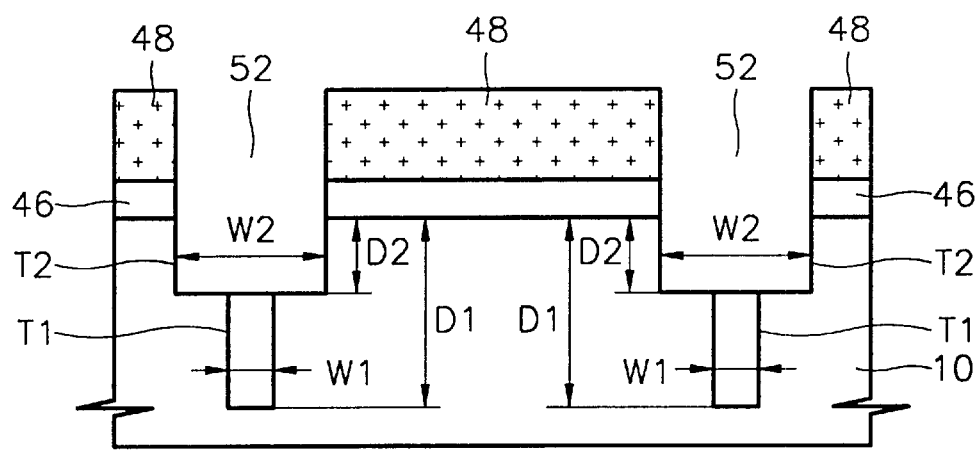

Referring to FIG. 11, a third mask pattern 48 which exposes the first gap-filling dielectric layer 46 by a second width W2 is formed on the first gap-filling dielectric layer 46. The third mask pattern 48 is preferably a material which has etching selectivity with respect to the first gap-filling dielectric layer 46. For example, if the first gap-filling dielectric layer 46 is silicon oxide layer, the third mask pattern 48 is preferably silicon nitride. The third mask pattern 48 can be formed to have a thickness between 500 Å and 2,500 Å. Openings 52 are formed by etching the first gap-filling dielectric layer 46 and the semiconductor substrate 10 using the third mask pattern 48 as an etching mask. This etching process can be, for example, a dry etching process. At this time, the opening 52 is preferably formed with an aspect ratio less than or equal to 3. As a result, wide trench regions T2 having the second width W2 and a second depth D2 are formed in the semiconductor substrate 10. The second depth D2 can be between 500 Å and 4,000 Å. The second depth D2 is less than the first depth D1 and the second width W2 is larger than the first width W1. A void (not shown) can be formed in the first gap-filling dielectric layer 46 which fills the narrow width trench regions T1. Therefore, the void can be opened in the process of forming the wide trench regions T2. However, when the wide trench regions T2 are filled with a second gap-filling dielectric in the following process, the opened void is filled with the second gap-filling dielectric. As a result, the void formed in the narrow width trench region T1 is not opened.

Figure 12:
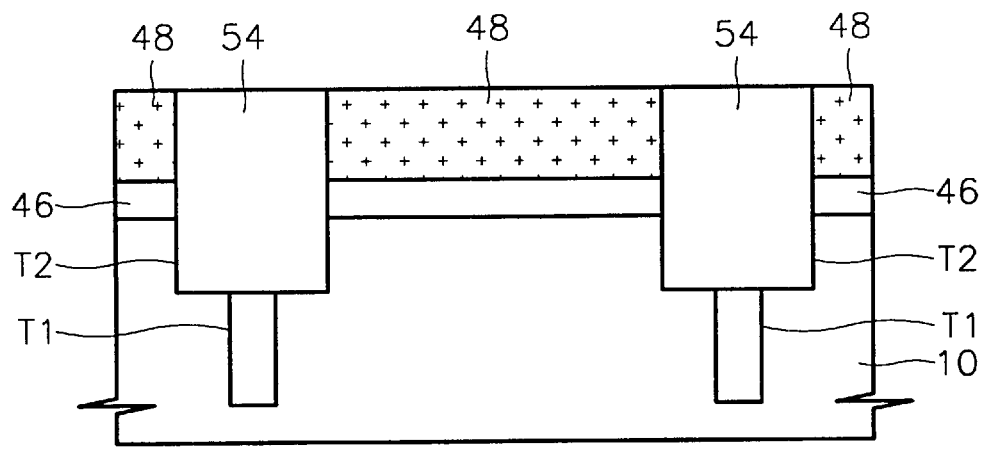

Referring to FIG. 12, second gap-filling dielectric layers 54 are formed in the openings (refer to 52 of FIG. 11) and on the third mask pattern 48. The second gap-filling dielectric layers 54 can be silicon oxide or silicon oxinitride. Then, the third mask pattern 48 is exposed by planarizing the entire surface of the semiconductor substrate 10 using an established method, for example, a CMP method or an etch back method. A thermal oxide layer (not shown) can be formed along the inner wall of the wide trench region T2 before forming the second gap-filling dielectric layers 54. Also, a nitride layer liner (not shown) may be formed on the thermal oxide layer.

The first gap-filling insulating layer 46 and the third mask pattern 48 which are formed on the semiconductor substrate 10 can be removed before forming the second gap-filling dielectric layers 54 on the third mask pattern 48 and in the openings (refer to 52 of FIG. 11). By doing so, it is possible to more effectively prevent the formation of the void in the second gap-filling dielectric layer 54 which fills the wide trench region T2. As a matter of fact, the void will not be formed even though the wide trench regions T2 are filled with the second gap-filling dielectric layer 54 formed on the semiconductor substrate 10 without removing the first gap-filling dielectric layer 46 and the third mask pattern 48. This is because the aspect ratio of the opening (refer to 52 of FIG. 11) is less than or equal to 3.

Figure 13:
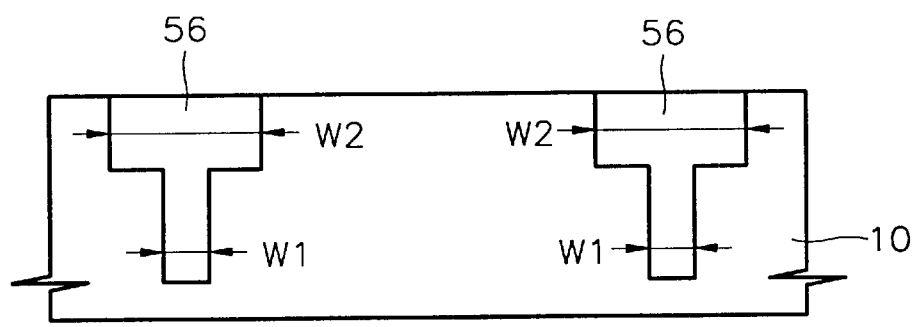

Referring to FIG. 13, T-shaped isolation layers 56 are formed by planarizing the entire surface of the semiconductor substrate 10, thus exposing the upper portion of the semiconductor substrate 10.

The first embodiment of the method of forming the T-shaped isolation layer according to the present invention was described with reference to the attached drawings. In the first embodiment, the narrow trench regions T1 are formed before the wide trench regions T2 are formed. The process of filling the insulating material in the narrow trench regions T1 and the wide trench regions T2 is separately performed.

Hereinafter, a second embodiment of the method of forming the T-shaped isolation layer according to the present invention will be described in detail with reference to the attached drawings. In the second embodiment, the wide trench regions T2 are formed before the narrow trench regions T1, unlike in the first embodiment. The narrow trench regions T1 and the wide trench regions T2 are filled with insulating material in the same process. The same reference numerals used in the first embodiment will also be used here for the widths and the depths of the narrow trench region T1 and the wide trench region T2.

Figure 14:
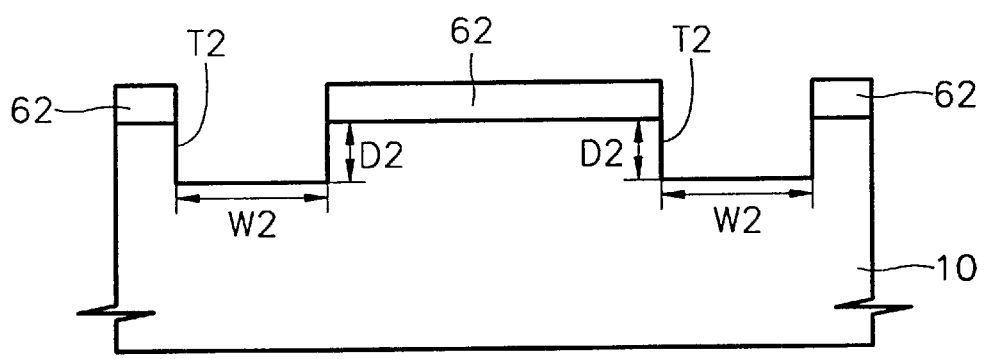
FIGS. 14 through 17 are sectional views showing a second embodiment of the method of forming the T-shaped isolation layer according to the present invention.

Referring to FIG. 14, a mask pattern 62 is formed on the semiconductor substrate 10. The mask pattern 62 can be a triple layer obtained by sequentially stacking a pad oxide layer, a silicon nitride layer, and a silicon oxide layer; a single layer such as a silicon oxide layer, a silicon nitride layer, or a silicon oxinitride layer; or a double layer obtained by combining any two of the above three layers. The mask pattern 62 can have a thickness between 1,500 Å and 4,000 Å. The semiconductor substrate 10 is etched using the mask pattern 62 as the etching mask. As a result, the wide trench regions T2 having the second width W2, and the second depth D2 which is between 500 Å and 4,000 Å, are formed. The wide trench regions T2 are formed using an established method, for example, the dry etching method.

Figure 15:
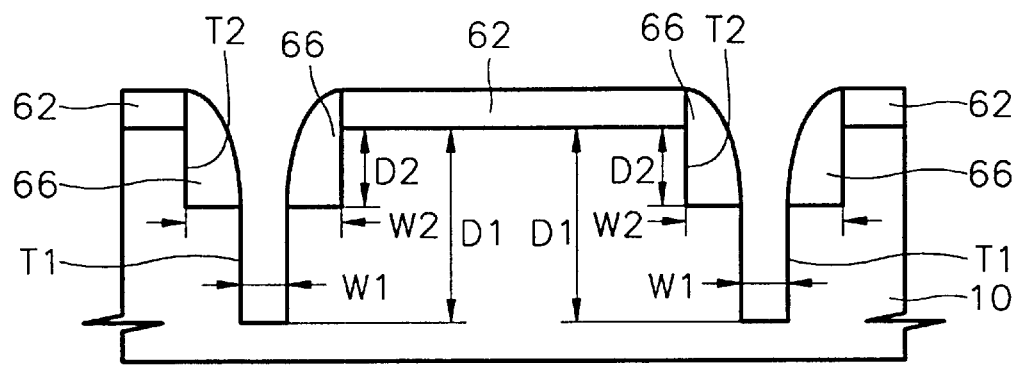

Referring to FIG. 15, an insulating layer is formed on the mask pattern 62 and inside the wide trench regions T2. Spacers 66 are formed on the side walls of the mask pattern 62 and the side walls of the wide trench regions T2 by anisotropically etching the insulating layer. The spacer 66 can be silicon oxide, silicon nitride, or silicon oxinitride. The spacers 66 are formed to have a thickness so that the wide trench regions T2 are not filled.

The semiconductor substrate 10 exposed under the wide trench regions T2 is etched using the mask pattern 62 and the spacers 66 as the etching masks. As a result, the narrow trench regions T1 with width W1 and depth D1 are formed. The narrow trench regions T1 are preferably so formed to a sufficient depth as to make adjacent semiconductor devices electrically isolated. Therefore, the depth D1 may be between 2,000 Å and 6,000 Å. The narrow trench regions T1 are formed using an established method, for example, the dry etching method.

Figure 16:
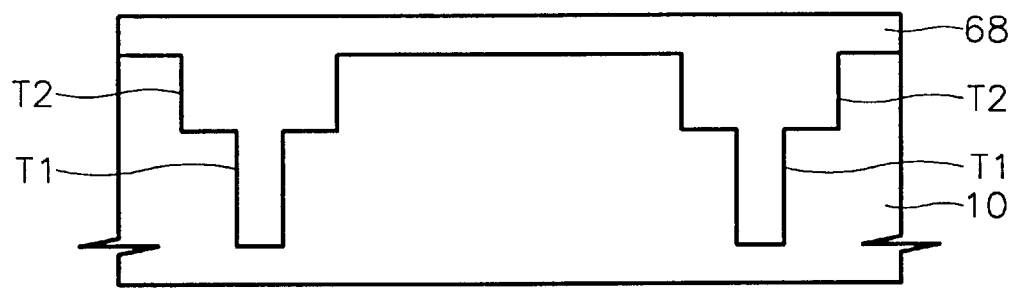

Referring to FIG. 16, the mask pattern 62 and the side wall spacers 66 are removed. A gap-filling dielectric layer 68 for filling the narrow trench regions T1 and the wide trench regions T2 is formed. The gap-filling dielectric layer 68 can be silicon oxide, silicon nitride, or silicon oxinitride. The gap-filling dielectric layer 68 is preferably formed using a CVD method. This is because the CVD method has an excellent step coverage characteristic. A thermal oxide layer (not shown) can be formed along the inner walls of the narrow trench regions T1 and the wide trench regions T2 before forming the gap-filling dielectric layer 68. Also, a nitride layer liner (not shown) can be formed on the thermal oxide layer.

The gap-filling dielectric layer 68 is formed after removing the mask pattern 62 and the spacers 66. However, it is possible to form the gap-filling dielectric layer 68 without removing the mask pattern 62 and the spacers 66, thereby reducing the number of processes.

Figure 17:
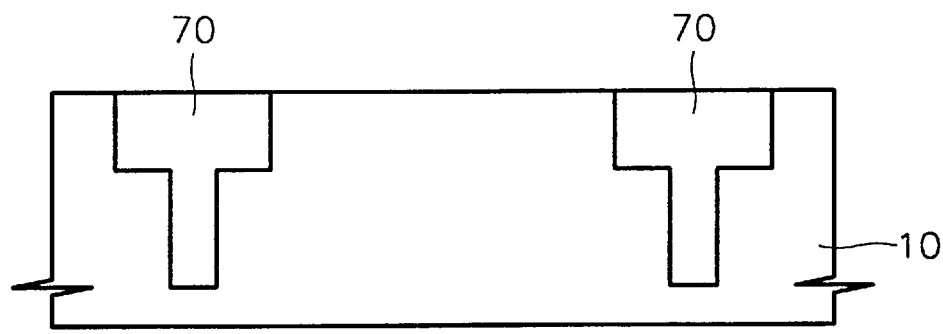

Referring to FIG. 17, the upper portion of the semiconductor substrate 10 is exposed by planarizing the entire surface on which the gap-filling dielectric layer 68 is formed. The planarizing can be performed using a CMP method or the etch back method. As a result, T-shaped isolation layers 70 are formed. Referring to FIGS. 16 and 17, even though voids may be formed in gap-filling dielectric layer 68 within narrow trench regions T1, the voids are not opened since the narrow trench regions T1 are covered by the gap-filling dielectric layer 68 which fills wide trench regions T2. Voids are not formed in wide trench regions T2. It is noted that the formation of non-opened voids within narrow trench regions T1 advantageously decreases parasitic capacitance due to the low dielectric constant of air. Also, the non-opened voids serve as stress buffers that decrease thermal expansion stress caused by the difference between the coefficients of the substrate and the gap-filling dielectric. Additionally, a decrease in junction leakage current can be achieved due to the decrease in thermal expansion stress.

Hereinafter, embodiments of a method of forming an elevated salicide source/drain region after having formed the T-shaped isolation layers according to the method described in the first and second embodiments will be described.

Figure 18:
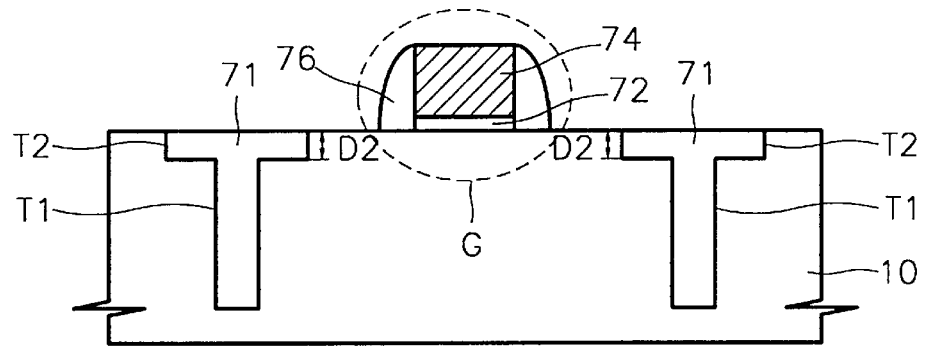
FIGS. 18 through 21 are sectional views showing embodiments of a method of forming an elevated salicide source/drain region according to the present invention.

Referring to FIG. 18, T-shaped isolation layers 71, in which the narrow trench regions T1 and the wide trench regions T2 are filled with the gap-filling dielectric layer, are formed. Two embodiments of the method of forming the T-shaped isolation layers 71 have been described. However, the depth D2 of the wide trench regions T2 is controlled such that impurities can be implanted into the lower portions (refer to 81 of FIG. 20) of the wide trench regions T2 in an ion-implantation process performed later on. Thus, the depth D2 is preferably controlled to be less than or equal to 1,000 Å. The gate electrode pattern G formed of a gate electrode 74 interposed with a gate oxide layer 72 and spacers 76 is formed on the active region defined by the T-shaped isolation layers 71. Conductive impurities of low density, for example, n-type impurities can be implanted using the gate electrode 74 as the ion implantation mask before the spacers 76 are formed on the side walls of the gate oxide layer 72 and the gate electrode 74.

Figure 19:
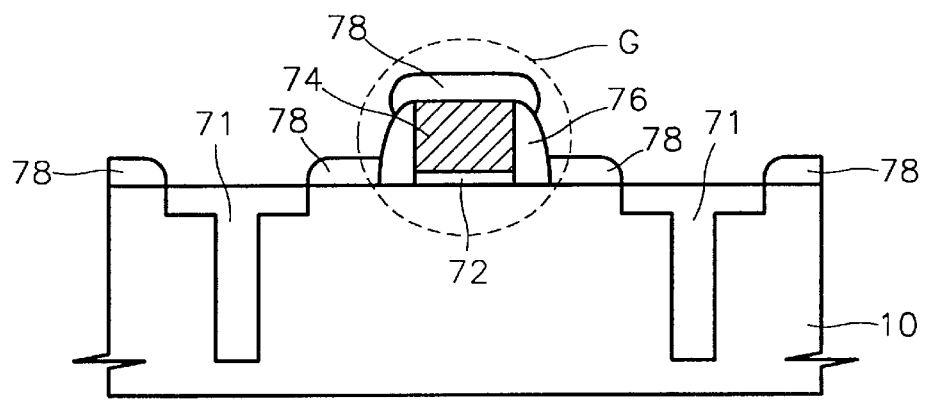

Referring to FIG. 19, semiconductor material layers 78 are grown on the surface of the exposed semiconductor substrate 10 on both sides of the gate electrode pattern G and on the upper surface of the gate electrode 74. The semiconductor material layers 78 can be silicon, germanium, or a compound of silicon and germanium. The semiconductor material layer 78 is preferably formed using a selective epitaxial growth (SEG) method.

Figure 20:
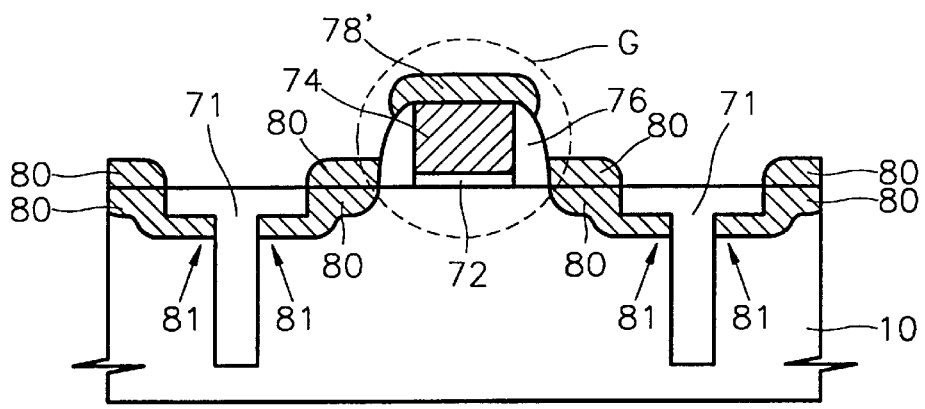

Referring to FIG. 20, conductive impurities, for example, n-type impurities are implanted using the gate electrode pattern G as the ion implantation mask. As a result, elevated source/drain regions 80 are formed. Also, a semiconductor material layer 78 doped with impurities is formed on the gate electrode 74. When conductive impurity ions are implanted to form the elevated source/drain regions 80, the energy of the ions is controlled so that a pn junction can be formed at a desired depth. In particular, the energy of the conductive impurity ions is controlled so that the impurities are implanted into the portions 81 beneath the wide trench regions, which constitute the heads of the T-shaped isolation layers 71 and are extended to both sides from the upper ends of the narrow trench regions. After forming the elevated source/drain regions 80, the implanted conductive impurities are activated by performing a thermal process. In case conductive impurities of low density were implanted into both sides of the gate electrode 74 before forming the side wall spacers 76, a lightly doped drain (LDD) (not shown) structure is formed by the ion-implantation process for forming elevated source/drain region 80.

Figure 21:
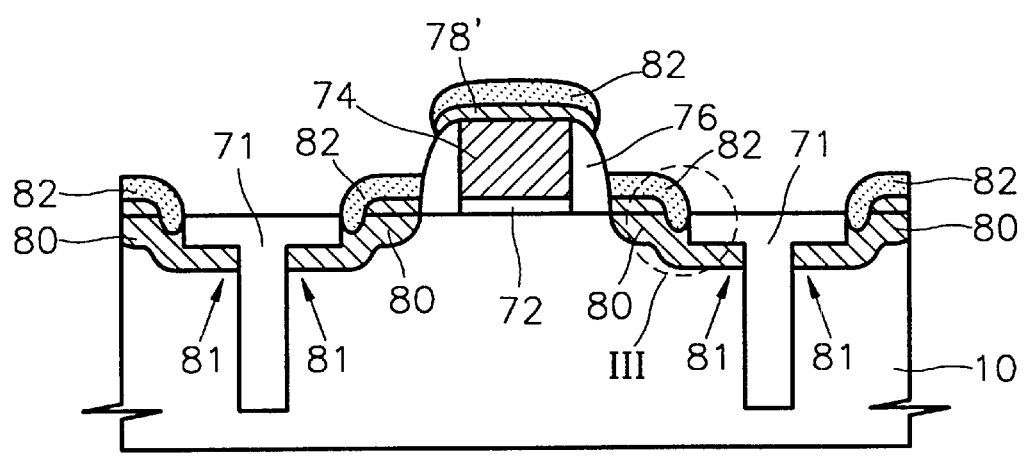

Referring to FIG. 21, a salicide process, involving first forming a transition metal layer on the entire surface of the semiconductor substrate 10 and then performing a thermal process, is performed so that self-aligned silicide layers 82 can be formed on the gate electrode 74 and the elevated source/drain regions 80. The transition metal layer can be Ti, Co, Ta, Ni, Pt, or a compound of the above metals. Meanwhile, when the semiconductor device has a design rule of 0.2 $\mu$m, the thermal process for silicifying the transition metal layer must be carefully selected. This is because the conductive impurities implanted in the elevated source/drain regions 80 can be thermally diffused, thus deteriorating the characteristics of the device such as the threshold voltage. To avoid this, the transition metal layer is preferably silicified using a rapid thermal process.

The portions of the transition metal layer which are not changed into the silicide layers 82 are removed after forming the suicide layers 82 on the gate electrode 74 and the elevated source/drain regions 80. As shown in III of FIG. 21, when the impurities are implanted in the portions 81 beneath the wide trench regions, which constitute the heads of the T-shaped isolation layers 71 and are extended to both sides from the upper ends of the narrow trench regions, it is possible to form a deep enough junction even though the suicide layers are formed to be thick at the boundary between the T-shaped isolation layers 71 and the elevated source/drain regions 80. As a result, it is possible to reduce the amount of the junction leakage current generated at the boundary between the isolation layers and the source/drain regions.

The embodiments of the semiconductor device including the T-shaped isolation layers according to the present invention were described in the process of describing the embodiments of the method of forming the T-shaped isolation layers according to the present invention. Therefore, further description of the embodiments of the semiconductor device including the T-shaped isolation layers according to the present invention is omitted.

It is possible to prevent the formation of voids in the isolation layers by the method of forming the T-shaped isolation layers according to the present invention. Also, even if voids are formed, it is possible to prevent the upper portions of the voids from being opened. Also, it is possible to improve the integration density of a semiconductor device since it is possible to secure enough of an isolation distance even in a narrow space.

It is possible to reduce the amount of junction leakage current generated at the boundary between the isolation layers and the source/drain regions by the method of forming the elevated salicide source/drain regions using the method of forming the T-shaped isolation layers according to the present invention.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor device comprising:

T-shaped isolation layers disposed in a semiconductor substrate, each said T-shaped isolation layer consisting of:
   a rectangular-shaped first portion that extends horizontally along a top surface of the substrate, said first portion extending to a depth D2 beneath a top surface thereof, said first portion having a width W2, and
   a rectangular-shaped second portion disposed beneath a part of the first portion and extending vertically into the substrate to a depth D1 greater than D2, said second portion having a width W1,
   where W2>W1;

gate electrodes disposed in an active region of the semiconductor substrate defined by the T-shaped isolation layers; and source/drain regions having impurities therein, said source/drain regions each including at least a portion thereof disposed beneath the rectangular-shaped first portion which is a head of the corresponding T-shaped isolation layers.

2. The semiconductor device of claim 1, wherein the source/drain regions each include at least a second portion thereof elevated above the semiconductor substrate.

3. The semiconductor device of claim 1, further comprising a salicide layer formed on the source/drain regions.

4. The semiconductor device of claim 2, further comprising a salicide layer formed on the source/drain regions.

5. The semiconductor device of claim 1, wherein the portion of the source/drain regions disposed beneath the rectangular-shaped first portion are spaced apart from a top surface of the semiconductor substrate.

6. The semiconductor device of claim 5, wherein the source/drain regions each include at least a second portion thereof elevated above the semiconductor substrate.

* * * * *